United States Patent
Chen et al.

(10) Patent No.: US 12,074,169 B2
(45) Date of Patent: Aug. 27, 2024

(54) STRUCTURES AND METHODS FOR TRENCH ISOLATION

(71) Applicant: Taiwan Semiconductor Manufacturing Co., Ltd., Hsin-Chu (TW)

(72) Inventors: Kuan-Jung Chen, Hsin-Chu (TW); Tsung-Lin Lee, New Taipei (TW); Chung-Ming Lin, Taichung (TW); Wen-Chih Chiang, Hsin-Chu (TW); Cheng-Hung Wang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 84 days.

(21) Appl. No.: 17/876,409

(22) Filed: Jul. 28, 2022

(65) Prior Publication Data
US 2022/0367523 A1   Nov. 17, 2022

Related U.S. Application Data

(62) Division of application No. 16/665,791, filed on Oct. 28, 2019, now Pat. No. 11,894,381.

(60) Provisional application No. 62/752,569, filed on Oct. 30, 2018.

(51) Int. Cl.
  *H01L 21/74*   (2006.01)
  *H01L 23/535*  (2006.01)
  *H01L 27/12*   (2006.01)

(52) U.S. Cl.
  CPC ........ *H01L 27/1203* (2013.01); *H01L 21/743* (2013.01); *H01L 23/535* (2013.01)

(58) Field of Classification Search
None
See application file for complete search history.

(56) References Cited

U.S. PATENT DOCUMENTS

| | | |
|---|---|---|
| 5,276,338 A | 1/1994 | Beyer |
| 6,413,835 B1 | 7/2002 | Norström |
| 8,841,174 B1 | 9/2014 | Di Sarro |
| 9,401,410 B2 | 7/2016 | Hu |
| 9,761,707 B1 | 9/2017 | Lin |
| 2003/0209776 A1 | 11/2003 | Desko |
| 2004/0018705 A1 | 1/2004 | Colson |
| 2007/0045732 A1 | 3/2007 | Lin |
| 2013/0147007 A1 | 6/2013 | Booth, Jr. |
| 2013/0209776 A1 | 8/2013 | Kim |
| 2014/0091281 A1 | 4/2014 | Cheng |
| 2014/0357039 A1 | 12/2014 | Liu et al. |

(Continued)

FOREIGN PATENT DOCUMENTS

TW   201813001 A   4/2018

*Primary Examiner* — Sarah K Salerno
(74) *Attorney, Agent, or Firm* — Duane Morris LLP

(57) ABSTRACT

Structures and methods for trench isolation are disclosed. In one example, a silicon-on-insulator (SOI) structure is disclosed. The SOI structure includes: a substrate, a dielectric layer and a polysilicon region. The substrate includes: a handle layer, an insulation layer arranged over the handle layer, a buried layer arranged over the insulation layer, and a trench extending downward from an upper surface of the buried layer and terminating in the handle layer. The dielectric layer is located on a bottom surface of the trench and contacting the handle layer. The polysilicon region is located in the trench and contacting the dielectric layer.

20 Claims, 9 Drawing Sheets

(56) References Cited

U.S. PATENT DOCUMENTS

2015/0017797 A1   1/2015  Park et al.
2017/0098616 A1   4/2017  Kaltalioglu et al.
2018/0082997 A1   3/2018  Li

330

340

STRUCTURES AND METHODS FOR TRENCH ISOLATION

RELATED APPLICATIONS

This application is a division of U.S. patent application Ser. No. 16/665,791, filed Oct. 28, 2019, which claims priority to U.S. Provisional Application No. 62/752,569, filed on Oct. 30, 2018, the contents of each are incorporated by reference herein in their entireties.

BACKGROUND

Deep trench capacitors and transistors can be used as memory elements in semiconductor structures or integrated circuits. For example, while a bipolar device can offer increased performance compared to counterparts such as complementary metal oxide semiconductor (CMOS) devices, an implementation of bipolar-CMOS (BiCMOS) may need additional features, e.g. deep trench features.

A wafer with deep trenches, e.g. a silicon-on-insulator (SOI) transistor wafer with deep trenches, is susceptible to process charging damage. This is because when the substrate and the gate are charged, the substrate voltage is dropped due to inductive charge of the deep trench. As such, an unbalanced voltage between the substrate and the gate will cause a gate oxide damage.

Thus, existing deep trench semiconductor structures and methods to make the same are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion. Like reference numerals denote like features throughout specification and drawings.

DETAILED DESCRIPTION OF EXEMPLARY EMBODIMENTS

Figure 1:
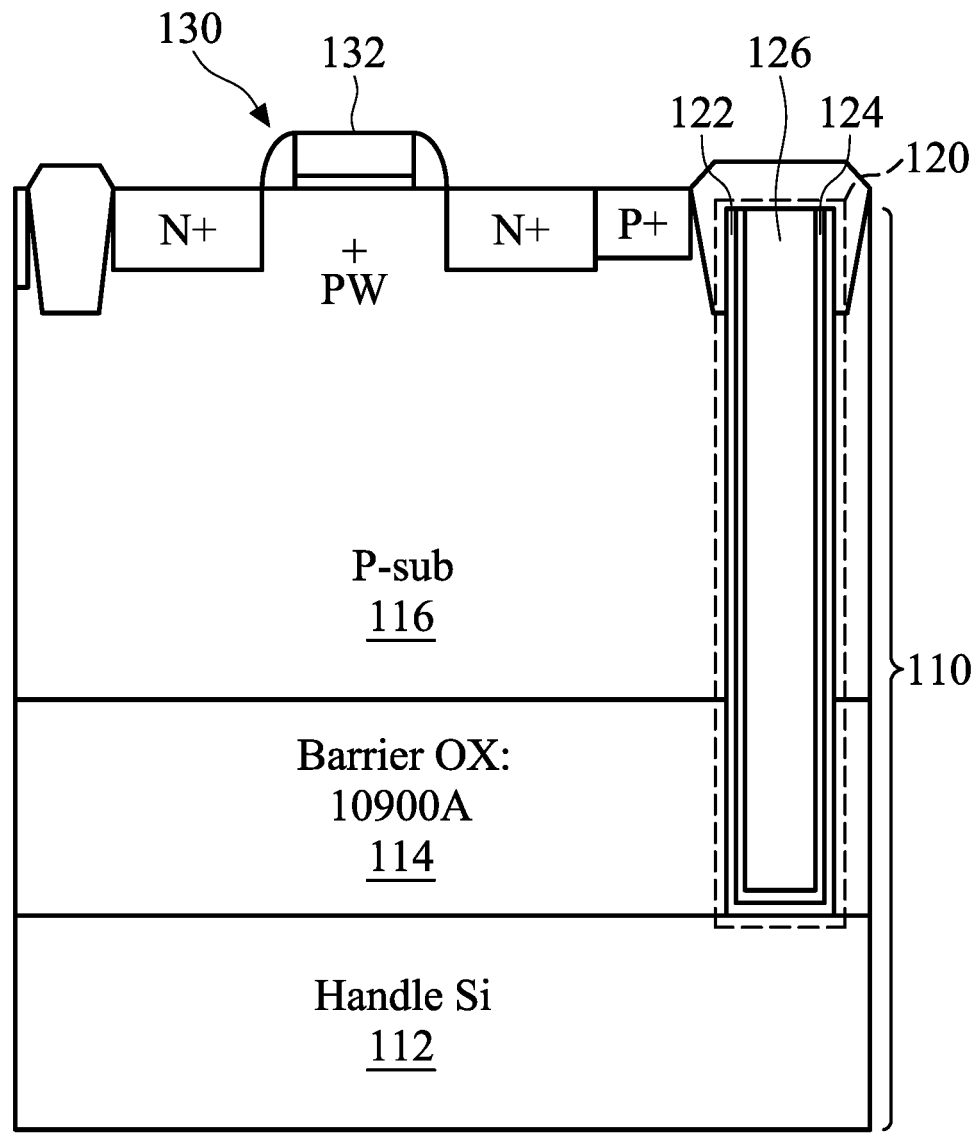
FIG. 1 illustrates a cross-sectional view of an exemplary silicon-on-insulator (SOI) structure with a trench isolation, in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

Deep trench techniques become more popular in integrated circuits (IC) with silicon-on-insulator (SOI) transistors, which are widely used for the fifth generation (5G) cellular mobile communications. To reduce process charging damage of a wafer with deep trench, the present disclosure provides various embodiments having a dielectric layer formed at the bottom of the deep trench to isolate the polysilicon in the deep trench from the substrate silicon. In various embodiments, the dielectric layer is designed to be thick enough to isolate the polysilicon in the deep trench from the substrate silicon, but not too thick. An over thick dielectric layer may cause a poor heat dissipation. In some embodiments, the dielectric layer comprises silicon oxide and has a thickness ranging between about 500 angstroms and about 0.1 micrometer. The dielectric layer may comprise one or more sub-layers of silicon oxide material. In one example, the dielectric layer comprises a sub-layer of lining oxide with a thickness between about 150 angstroms and about 300 angstroms, e.g. about 250 angstroms, and a sub-layer of pad oxide with a thickness between about 350 angstroms and about 1000 angstroms, e.g. about 500 angstroms.

The present disclosure is applicable to any semiconductor structure with a trench, especially for SOI structures and especially for a trench having a depth greater than about 2 micrometers. The disclosed trench isolation structure can reduce deep trench inductive charge and greatly improve the wafer yield. In the present disclosure, the terms "charging," and "process charging" may be interchangeably used.

FIG. 1 illustrates a cross-sectional view of an exemplary silicon-on-insulator (SOI) structure 100 with a trench isolation, in accordance with some embodiments of the present disclosure. As shown in FIG. 1, the SOI structure 100 includes a transistor 130 formed on a SOI substrate 110. The SOI substrate 110 includes a handle layer 112, an insulation layer 114 arranged over the handle layer 112, and a p-type substrate layer 116 arranged over the insulation layer 114 to form a p-type well. In an alternative embodiment, the substrate layer 116 may be n-type substrate to form an n-type well.

In the SOI structure of the substrate 110 in this example, both the handle layer 112 and the p-type substrate layer 116 include silicon, while the insulation layer 114 includes oxide, e.g. silicon dioxide, as an insulator or barrier between the handle layer 112 and the p-type substrate layer 116. In one embodiment, as shown in FIG. 1, the insulation layer 114 has a depth of about 1 micrometer, e.g. 10900 angstroms.

As shown in FIG. 1, there is a trench 120 extending downward from an upper surface of the p-type substrate layer 116 and terminating in the handle layer 112. Although the bottom of the trench 120 in FIG. 1 is coplanar with the top surface of the handle layer 112, the trench 120 may also be formed by over-etching the handle layer 112 such that the bottom of the trench 120 is below the top surface of the handle layer 112 according to various embodiments of the present teaching. In one embodiment, the trench 120 may have a depth greater than about 2 micrometers, e.g. a depth of about 3.5 micrometers, based on customer requirement. The depth of the trench 120 may depend on the thicknesses of the insulation layer 114 and the substrate layer 116, which may in turn depend on design requirement and customer need.

As shown in FIG. 1, a dielectric layer is formed on a bottom surface of the trench 120 and contacting the handle layer 112. The dielectric layer may include multiple sub-layers of silicon oxide. For example, as shown in FIG. 1, the dielectric layer includes a sub-layer 122 of lining oxide formed from the bottom of the trench 120 and a sub-layer 124 of tetraethoxysilane (TEOS) formed on the sub-layer 122. In one embodiment, the sub-layer 122 of lining oxide is formed mainly for reducing stress in the SOI structure 100; and the sub-layer 124 of TEOS is formed mainly for isolation between the polysilicon region 126 and the handle layer 112.

In addition, a polysilicon region 126 is located in the trench 120 and contacting the dielectric layer. The polysilicon region 126 includes polysilicon, which would directly contact the silicon in the handle layer 112 if there was no dielectric layer isolation between the polysilicon region 126 and the handle layer 112. While the dielectric layer isolates the polysilicon region 126 from the handle layer 112 in this example, there is no deep trench inductive charge generated during a processing charging of the transistor 130. That is, there is no unbalanced voltage between the p-type substrate layer 116 of the substrate 110 and the gate 132 of the transistor 130 to cause gate oxide damage or process charging damage to the transistor 130. Details of the reduction or removal of the process charging damage will be discussed with respect to FIG. 2.

Figure 2:
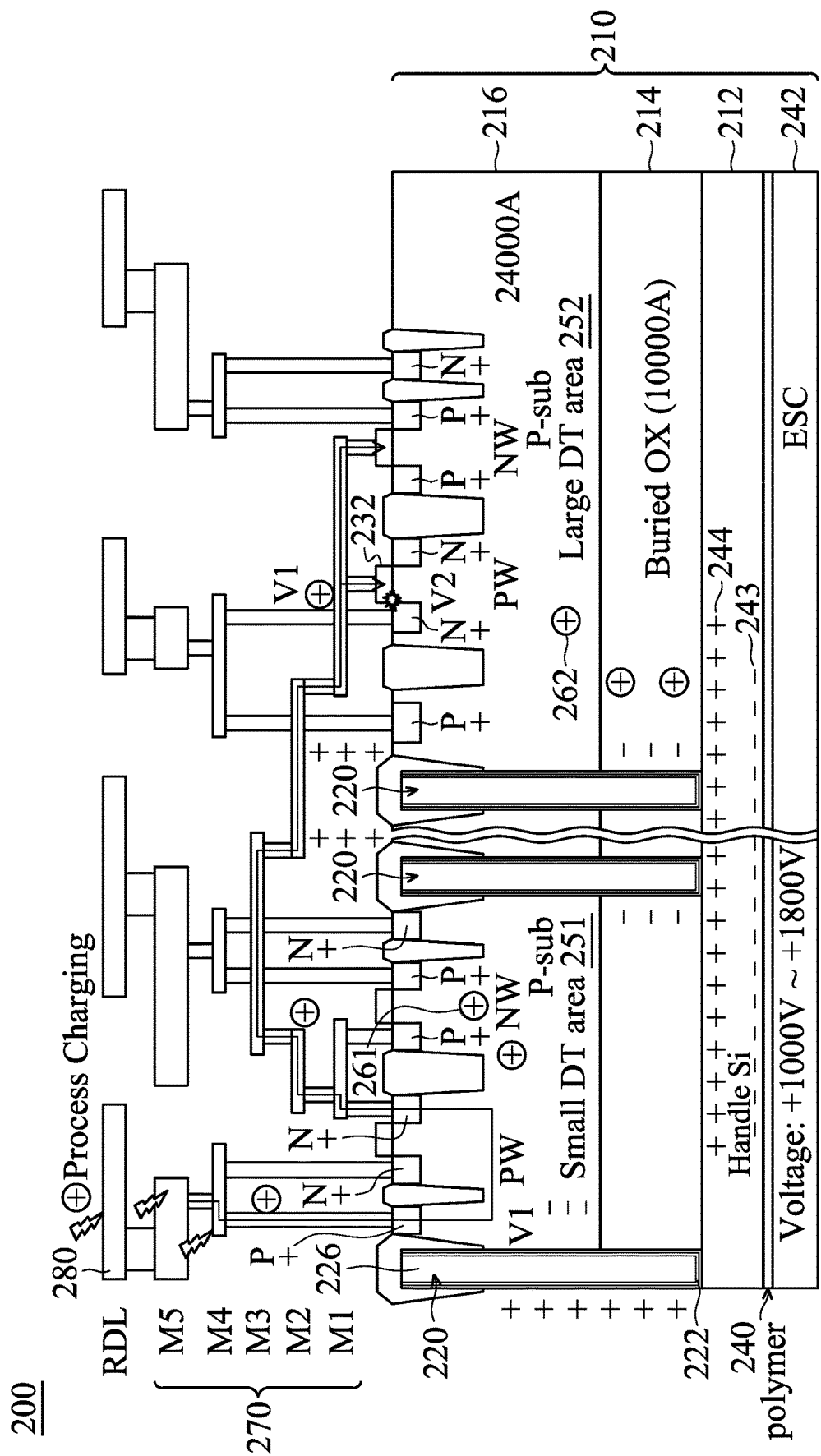
FIG. 2 illustrates a cross-sectional view of another exemplary SOI structure with trench isolations, in accordance with some embodiments of the present disclosure.

FIG. 2 illustrates a cross-sectional view of another exemplary SOI structure 200 with trench isolations, in accordance with some embodiments of the present disclosure. As shown in FIG. 2, the SOI structure 200 in this example is a transistor wafer that includes transistors formed on a SOI substrate 210. The SOI substrate 210 includes a handle layer 212, an insulation layer 214 arranged over the handle layer 212, and a p-type substrate layer 216 arranged over the insulation layer 214.

In the SOI structure of the substrate 210 in this example, both the handle layer 212 and the p-type substrate layer 216 include silicon, while the insulation layer 214 includes buried oxide, e.g. silicon dioxide, as an insulator or barrier between the handle layer 212 and the p-type substrate layer 216. In one embodiment, as shown in FIG. 2, the insulation layer 214 has a depth of about 1 micrometer; and the p-type substrate layer 216 has a depth of about 2.4 micrometers.

As shown in FIG. 2, there are multiple trenches 220 each of which extends downward from an upper surface of the p-type substrate layer 216 and terminates in the handle layer 212. In one embodiment, each trench 220 may have a depth greater than about 2 micrometers, e.g. a depth of about 3.5 micrometers. The trenches 220 divide the p-type substrate layer 216 into a plurality of functional areas each of which is formed between a pair of adjacent trenches. In the example shown in FIG. 2, the plurality of functional areas includes a small functional area 251 and a large functional area 252 that is larger than the small functional area 251.

As shown in FIG. 2, an electrostatic chuck (ESC) 242 is formed below the SOI substrate 210 for holding the SOI substrate 210 in a process chamber. In addition, there is a polymer layer 240 formed between the SOI substrate 210 and the ESC 242. The polymer layer 240 is a thin insulator layer that can maximize electrostatic attractive forces between the substrate and the ESC 242. In one embodiment, a voltage source electrically biases the substrate 210 with respect to the ESC 242. The insulator 240 prevents the flow of electrons there through, causing opposing electrostatic charge to accumulate in the substrate 210 and in the ESC 242, thereby generating an electrostatic force that attracts and holds the substrate 210 onto the chuck 242. While the SOI substrate 210 is electrostatically held, a voltage applied to electrodes in the ESC 242 is high, e.g. +1000 volts to +1800 volts as shown in FIG. 2. This high voltage causes electrons or negative charges 243 accumulating at the bottom of the handle layer 212 and positive charges 244 accumulating at the top of the handle layer 212.

As shown in FIG. 2, a dielectric layer 222 is formed on a bottom surface of each trench 220 and contacting the handle layer 212. In addition, a polysilicon region 226 is located in each trench 220 and contacting the dielectric layer 222. The polysilicon region 226 includes polysilicon, which would directly contact the silicon in the handle layer 212 if there was no dielectric layer isolation between the polysilicon region 226 and the handle layer 212. In that case, there would be positive charges accumulating in the trenches 220 as well, which would cause many deep trench inductive charges accumulating in the p-type substrate layer 216. This in turn will cause the substrate voltage V2 to drop below the gate voltage V1. As discussed before, this unbalanced voltage between the substrate 210 and the gate 232 would cause gate oxide damage during process charging.

In contrast, as shown in FIG. 2 in this example, the dielectric layer 222 isolates the polysilicon region 226 from the handle layer 212. As such, there is no positive charge accumulating in the trenches 220. Therefore, the deep trench inductive charges 261, 262 are dramatically reduced or totally removed in the p-type substrate layer 216. That is, during process charging, there is little or no unbalanced voltage between the p-type substrate layer 216 of the substrate 210 and the gates 232 of the transistors to cause gate oxide damage or process charging damage.

As shown in FIG. 2, there are some metal layers M1~M5 270 above the transistors, with the M1 layer at the bottom and the M5 layer at the top. A redistribution layer (RDL) 280 is formed over the M5 layer. The transistors may be electrically connected through metal lines across the metal layers M1~M5 270. During a process charging, charges are input from the RDL layer 280, through the metal layers M1~M5 270, into the transistors and the substrate 210.

In one embodiment, the small functional area 251 can be quickly charged to full due to a small size of the small functional area 251. The large functional area 252 is still being charged when the small functional area 251 is fully charged. In this case, while both the small functional area 251 and the gate 232 above the large functional area 252 are charged to V1, the large functional area 252 may have a voltage V2 that is less than V1 and has yet to be charged to V1. The more quickly the large functional area 252 is charged to V1 or charged fully, the less gate oxide damage or process charging damage is caused at the large functional area 252 due to the unbalanced voltage between V1 and V2. As such, the dielectric layer 222 isolation between the polysilicon region 226 and the handle layer 212 contributes more to the large functional area 252 compared to the small functional area 251. Since the dielectric layer 222 isolation reduces deep trench inductive charge 262 in the large functional area 252, the speed of charging the large functional area 252 can also be improved. Therefore, the large functional area 252 can be charged to V1 or charged fully in a shorter time to avoid gate oxide damage or process charging damage.

As shown in FIG. 2, the dielectric layer 222 extends to sidewalls of each trench 220. According to various embodiments of the present teaching, the dielectric layer 222 may have different materials on the bottom of a trench and on the sidewall of the trench. In one embodiment, the dielectric layer 222 may only cover the bottom of a trench, without extending to the sidewall of the trench.

The dielectric layer 222 may include multiple sub-layers of silicon oxide. In one example, the dielectric layer 222 includes a sub-layer of lining oxide formed from the bottom of the trench 220 and a sub-layer of pad oxide formed on the sub-layer of lining oxide. In one example, the sub-layer of lining oxide has a thickness between about 150 angstroms and about 300 angstroms, e.g. about 250 angstroms; and the sub-layer of pad oxide has a thickness between about 350 angstroms and about 1000 angstroms, e.g. about 500 angstroms. In one embodiment, the pad oxide may comprise tetraethoxysilane (TEOS).

FIGS. 3A, 3B, 3C, 3D, 3E, 3F, 3G, 3H, 3I, 3J and 3K illustrate cross-sectional views of an exemplary SOI structure during various fabrication stages, in accordance with some embodiments of the present disclosure. In some embodiments, the SOI structure may include a substrate for a semiconductor device included in an integrated circuit (IC). FIGS. 3A through 3K are simplified for a better understanding of the concepts of the present disclosure. For example, the IC, in which the SOI structure is formed, may include a number of other devices comprising resistors, capacitors, transistors, inductors, fuses, etc., which are not shown in FIGS. 3A through 3K, for purposes of clarity of illustration.

Figure 3A:
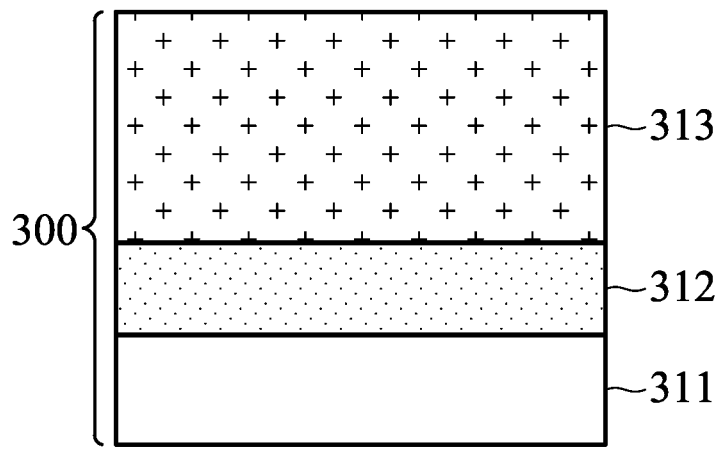
FIGS. 3A, 3B, 3C, 3D, 3E, 3F, 3G, 3H, 3I, 3J and 3K illustrate cross-sectional views of an exemplary SOI structure during various fabrication stages, in accordance with some embodiments of the present disclosure.

FIG. 3A is a cross-sectional view of a SOI substrate 300, which is provided, at one 310 of the various stages of fabrication, according to some embodiments of the present disclosure. The SOI substrate 300 in FIG. 3A may be formed by depositing an insulation layer 312 on a handle layer 311; and then a buried layer 313 on the insulation layer 312. Both the handle layer 311 and the buried layer 313 include silicon, while the insulation layer 312 includes oxide, e.g. silicon dioxide, as an insulator or barrier between the handle layer 311 and the buried layer 313.

Figure 3B:
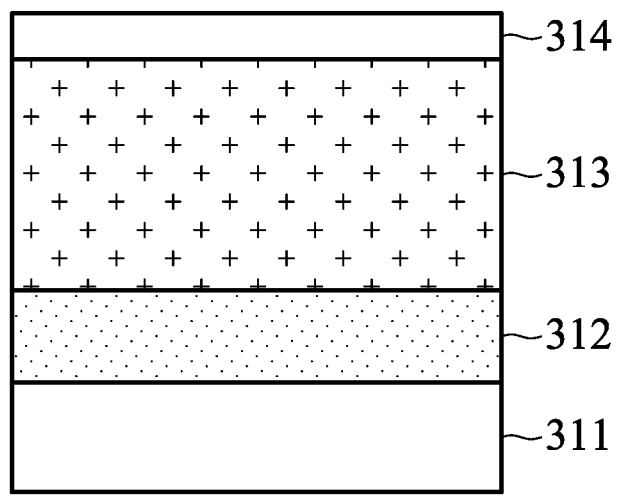

FIG. 3B is a cross-sectional view of the SOI structure including a shallow trench isolation (STI) layer 314, which is provided, at one 320 of the various stages of fabrication, according to some embodiments of the present disclosure. As shown in FIG. 3B, the STI layer 314 is formed on the buried layer 313. In one example, the STI layer 314 may have a thickness of about 4200 angstroms and include dielectric material like silicon oxide.

Figure 3C:
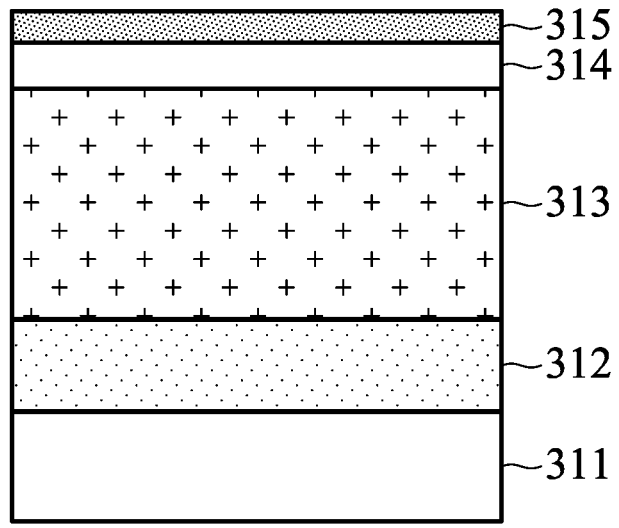

FIG. 3C is a cross-sectional view of the SOI structure including a silicon nitride layer 315, which is provided, at one 330 of the various stages of fabrication, according to some embodiments of the present disclosure. As shown in FIG. 3C, the silicon nitride layer 315 is formed on the STI layer 314. In one example, the silicon nitride layer 315 may have a thickness of about 2000 angstroms and include material like silicon nitride.

Figure 3D:
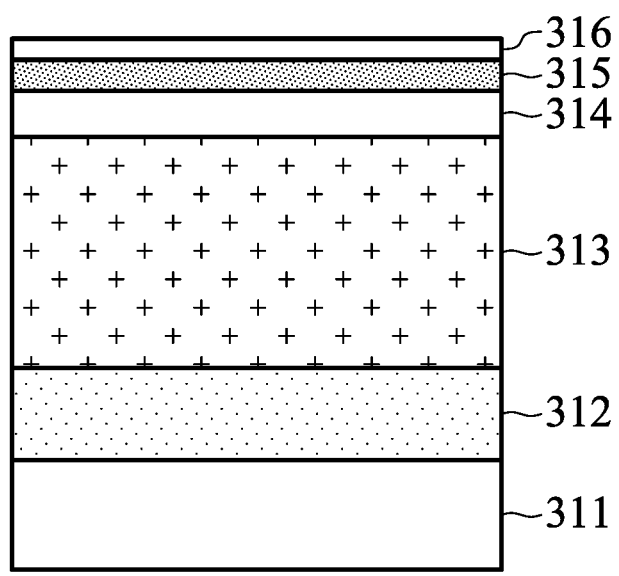

FIG. 3D is a cross-sectional view of the SOI structure including a hard mask insulation layer 316, which is provided, at one 340 of the various stages of fabrication, according to some embodiments of the present disclosure. As shown in FIG. 3D, the hard mask insulation layer 316 is formed on the silicon nitride layer 315. In one example, the hard mask insulation layer 316 may have a thickness of about 1000 angstroms and include hard mask oxide material. In one embodiment, the STI layer 314, the silicon nitride layer 315, and the hard mask insulation layer 316 may be treated together as a protection layer for the substrate.

Figure 3E:
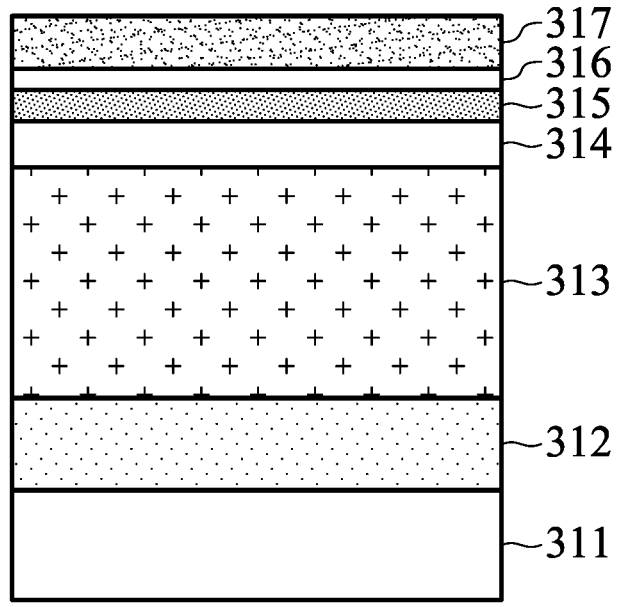

FIG. 3E is a cross-sectional view of the SOI structure including a polysilicon layer 317, which is provided, at one 350 of the various stages of fabrication, according to some embodiments of the present disclosure. As shown in FIG. 3E, the polysilicon layer 317 is formed on the hard mask insulation layer 316. In one example, the polysilicon layer 317 may have a thickness of about 2000 angstroms and include material like polysilicon.

Figure 3F:
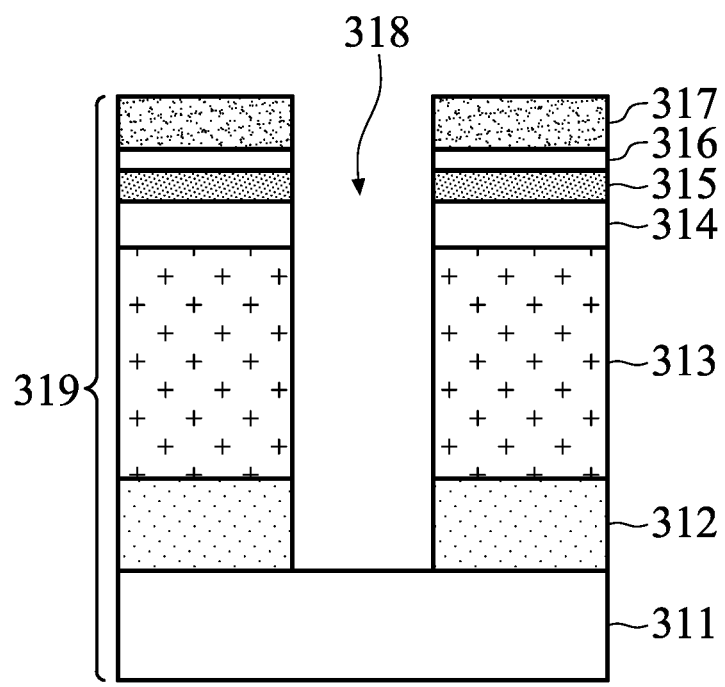

FIG. 3F is a cross-sectional view of the SOI structure 319 having a trench 318, which is provided, at one 360 of the various stages of fabrication, according to some embodiments of the present disclosure. The SOI structure 319 in FIG. 3F includes the handle layer 311, the insulation layer 312, the buried layer 313, the STI layer 314, the silicon nitride layer 315, the hard mask insulation layer 316, and the polysilicon layer 317. In one embodiment, at operation 360, an etch is performed into the SOI structure 319 to form the trench 318. Specifically, the trench 318 may be formed by etching deeply into the buried oxide of the insulation layer 312, such that a bottom of the trench 318 is in or at the handle layer 311. As shown in FIG. 3F, the trench 318 extends downward from an upper surface of the polysilicon layer 317 to the handle layer 311.

Figure 3G:
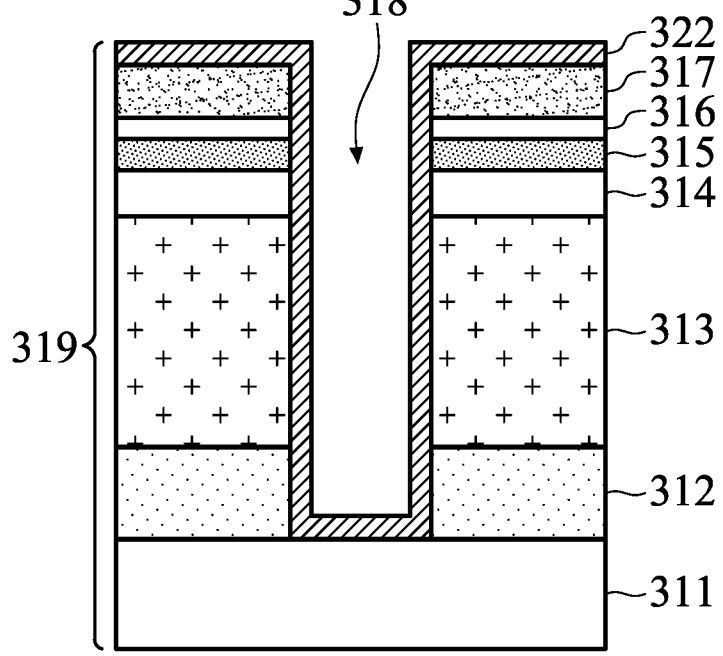

FIG. 3G is a cross-sectional view of the SOI structure 319 including a dielectric layer 322, which is formed on the polysilicon layer 317 at one 370 of the various stages of fabrication, according to some embodiments of the present disclosure. As shown in FIG. 3G, the dielectric layer 322 has a profile that covers the top surface of the polysilicon layer 317, the sidewalls of the trench 318, and the bottom surface of the trench 318.

As shown in FIG. 3G, at least part of the dielectric layer 322 is formed on the bottom surface of the trench 318 and contacting the handle layer 112. In one embodiment, the dielectric layer 322 includes multiple sub-layers of silicon oxide. For example, at the operation 370, the dielectric layer 222 may be formed by first forming a sub-layer of lining oxide on in the trench 318 and on top of the polysilicon layer 317, and then forming a sub-layer of pad oxide over the sub-layer of lining oxide. In one example, the sub-layer of lining oxide has a thickness between about 150 angstroms and about 300 angstroms, e.g. about 250 angstroms; and the sub-layer of pad oxide has a thickness between about 350 angstroms and about 1000 angstroms, e.g. about 500 angstroms. In one embodiment, the pad oxide may comprise tetraethoxysilane (TEOS).

Figure 3H:
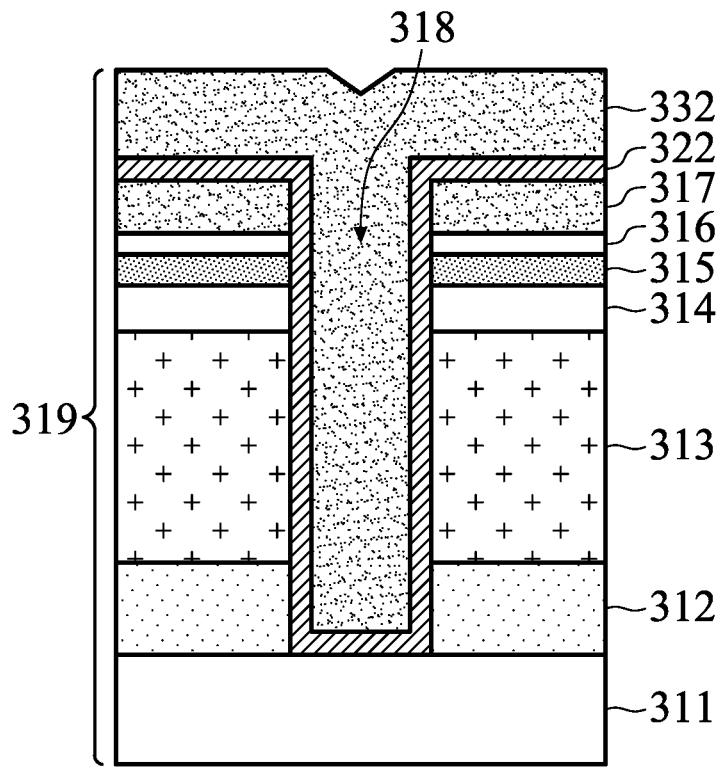

FIG. 3H is a cross-sectional view of the SOI structure 319 including a polysilicon region 332, which is formed on the dielectric layer 322 at one 380 of the various stages of fabrication, according to some embodiments of the present disclosure. As shown in FIG. 3H, the polysilicon region 332 is formed to fill the trench 318 and cover the dielectric layer 322 over the polysilicon layer 317. The polysilicon region 332 includes polysilicon that contacts directly on the dielectric layer 322. That is, the polysilicon in the polysilicon region 332 would directly contact the silicon in the handle layer 311 if there was no dielectric layer isolation between the polysilicon region 332 and the handle layer 311. At the operation 380, the polysilicon region 332 may be formed by depositing polysilicon into the trench 318 and onto the dielectric layer 322. In one example, the portion of the polysilicon region 332 on the dielectric layer 322 over the polysilicon layer 317 has a thickness of about 7500 angstroms.

Figure 3I:
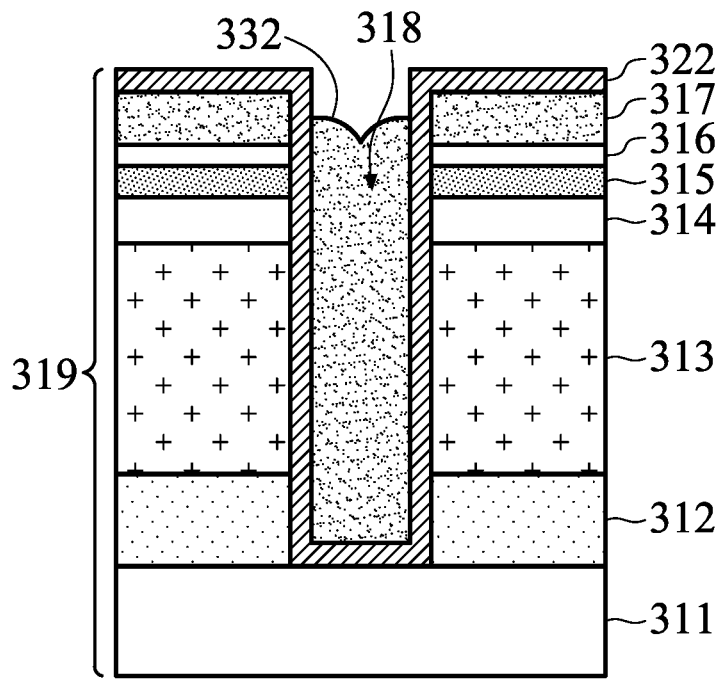

FIG. 3I is a cross-sectional view of the SOI structure 319 in which part of the polysilicon region 332 is etched, at one 390 of the various stages of fabrication, according to some embodiments of the present disclosure. According to some embodiments, at operation 390, an etching process, e.g. a dry etching process, is performed to remove portions of the polysilicon region 332 above the polysilicon layer 317. The etching process for the polysilicon stops on the dielectric layer 322 that includes mask oxide. In some embodiments, a cleaning process and/or a soft/hard baking process are performed following the dry etching process in the operation 390. Compared to FIG. 3H, the polysilicon region 332 in FIG. 3I only has portions left in the trench 318, not above the polysilicon layer 317.

Figure 3J:
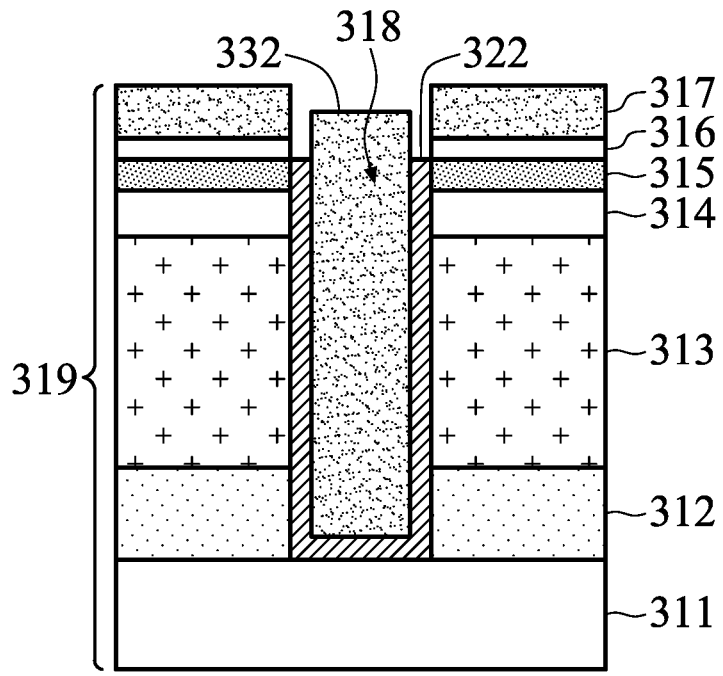

FIG. 3J is a cross-sectional view of the SOI structure 319 in which part of the dielectric layer 322 is etched, at one 392 of the various stages of fabrication, according to some embodiments of the present disclosure. According to some embodiments, at operation 392, an etching process, e.g. a wet etching process, is performed to remove portions of the dielectric layer 322 above the polysilicon layer 317 and the polysilicon region 332. The etching process for the oxide of the dielectric layer 322 stops on the polysilicon of the polysilicon layer 317 and the polysilicon region 332. In some embodiments, a cleaning process and/or a soft/hard baking process are performed following the wet etching process in the operation 392. Compared to FIG. 3I, the dielectric layer 322 in FIG. 3J only has portions left in the trench 318.

Figure 3K:
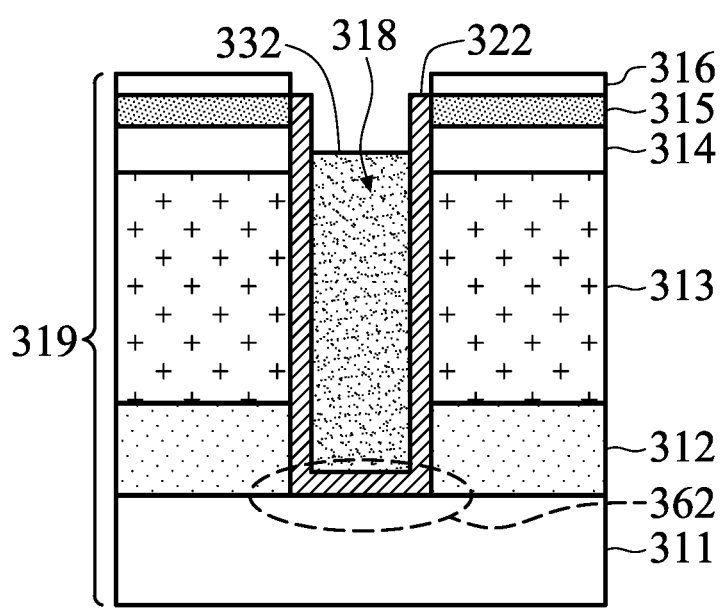

FIG. 3K is a cross-sectional view of the SOI structure 319 in which the polysilicon layer 317 and part of the polysilicon region 332 are etched, at one 394 of the various stages of fabrication, according to some embodiments of the present disclosure. According to some embodiments, at operation 394, an etching process, e.g. a dry etching process, is performed to remove polysilicon of the polysilicon layer 317 as well as part of the polysilicon region 332. The etching process for the polysilicon stops on the hard mask insulation layer 316 and the dielectric layer 322 that includes hard mask oxide. In some embodiments, a cleaning process and/or a soft/hard baking process are performed following the wet etching process in the operation 394. Compared to FIG. 3J, the polysilicon layer 317 has been removed and a top portion of the polysilicon region 332 in the trench 318 has also been removed due to the etching in FIG. 3K. As the hard mask oxide stops the etching at operation 394, a top surface of the polysilicon region 332 after the etching is not much lower than the hard mask insulation layer 316.

As shown in FIG. 3K, after the operation 394, the dielectric layer 322 includes a portion 362 at the bottom of the trench 318 to isolate the polysilicon region 332 from the handle layer 311. As discussed above, based on this deep trench isolation, there will be little or no deep trench inductive charge generated during a processing charging. That is, there is no unbalanced voltage between the substrate 300 and a gate of a transistor on the substrate 300 to cause gate oxide damage or process charging damage.

A wafer of SOI structure 420 with trench isolation, e.g. formed following operations shown in FIGS. 3A-3F, achieves a CP yield much higher than a yield achieved by a wafer of original SOI structure 410 without a trench isolation. In one embodiment, the yield improvement is more dramatic for deeper trenches in a wafer, e.g. a trench with a depth greater than about 2 micrometers or a depth of about 3.5 micrometers.

Figure 4:
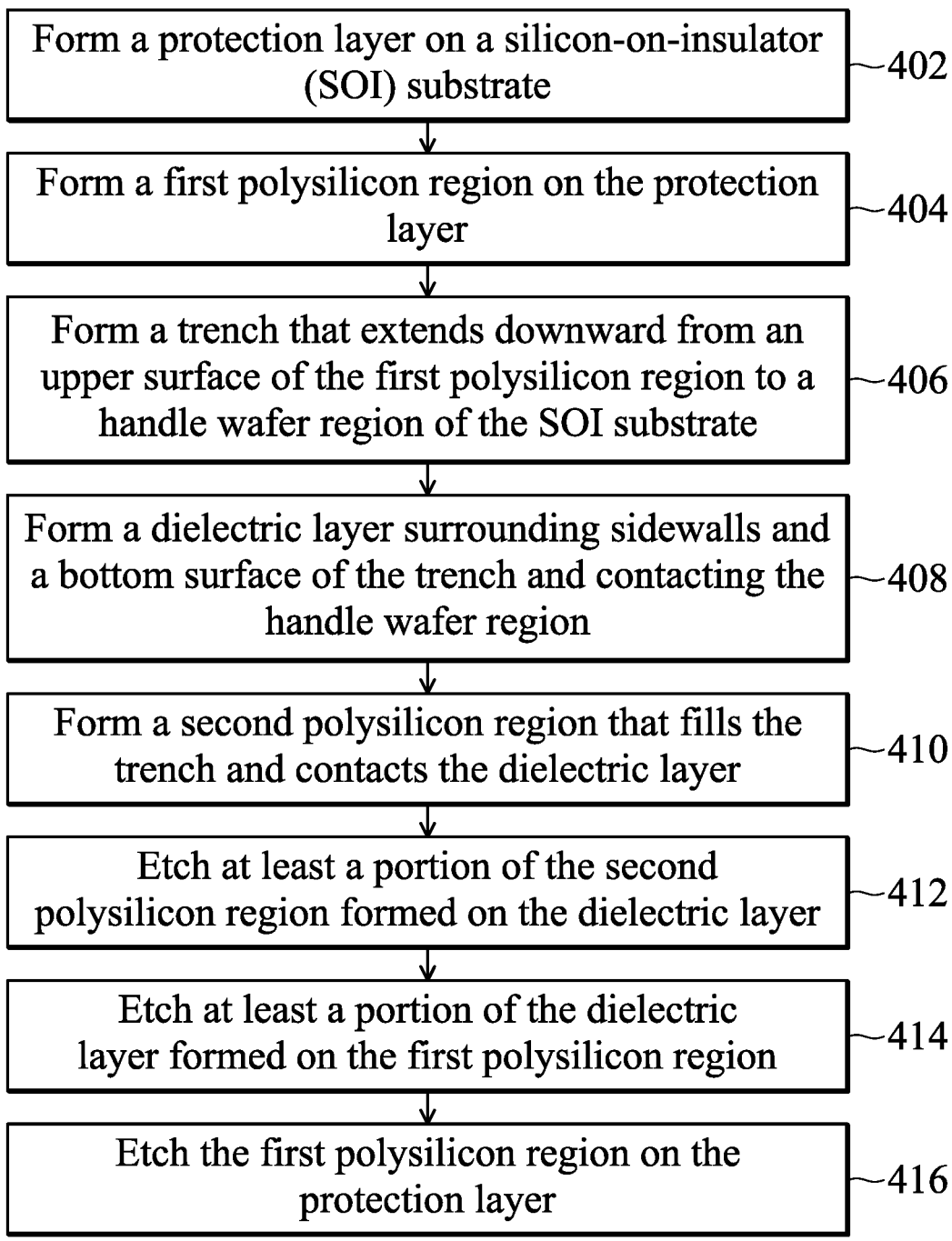
FIG. 4 shows a flow chart illustrating an exemplary method for forming a semiconductor structure, in accordance with some embodiments of the present disclosure.

FIG. 4 is a flow chart illustrating an exemplary method 400 for forming a semiconductor structure, in accordance with some embodiments of the present disclosure. At operation 402, a protection layer is formed on a silicon-on-insulator (SOI) substrate. A first polysilicon region is formed at operation 404 on the protection layer. A trench is formed at 406 to extend downward from an upper surface of the first polysilicon region to a handle layer of the SOI substrate. A dielectric layer is formed at operation 408 to surround sidewalls and a bottom surface of the trench and contact the handle layer. A second polysilicon region is formed at 410 to fill the trench and contact the dielectric layer. At operation 412, at least a portion of the second polysilicon region formed on the dielectric layer is etched. At operation 414, at least a portion of the dielectric layer formed on the first polysilicon region is etched. At operation 416, the first polysilicon region on the protection layer is etched. It can be understood that the order of the steps shown in FIG. 4 may be changed according to different embodiments of the present disclosure.

In an embodiment, a silicon-on-insulator (SOI) structure is disclosed. The SOI structure includes: a substrate, a dielectric layer and a polysilicon region. The substrate includes: a handle layer, an insulation layer arranged over the handle layer, a buried layer arranged over the insulation layer, and a trench extending downward from an upper surface of the buried layer and terminating in the handle layer. The dielectric layer is located on a bottom surface of the trench and contacting the handle layer. The polysilicon region is located in the trench and contacting the dielectric layer.

In another embodiment, a semiconductor structure is disclosed. The semiconductor structure includes: a substrate and a dielectric layer. The substrate that includes: a handle layer, an insulation layer arranged over the handle layer, a buried layer arranged over the insulation layer, and a plurality of trenches each of which extends downward from an upper surface of the buried layer and terminates in the handle layer. The dielectric layer is located on a bottom surface of each of the plurality of trenches and contacting the handle layer.

In yet another embodiment, a method for forming a semiconductor structure is disclosed. The method includes: forming a protection layer on a silicon-on-insulator (SOI) substrate; forming a first polysilicon region on the protection layer; forming a trench that extends downward from an upper surface of the first polysilicon region and terminates in a handle layer of the SOI substrate; forming a dielectric layer surrounding sidewalls and a bottom surface of the trench and contacting the handle layer; and forming a second polysilicon region that fills the trench and contacts the dielectric layer.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   forming a protection layer on a silicon-on-insulator (SOI) substrate;
   forming a first polysilicon region on the protection layer;
   forming a trench that extends downward from an upper surface of the first polysilicon region and terminates in a handle layer of the SOI substrate;
   forming a dielectric layer surrounding sidewalls and a bottom surface of the trench and contacting the handle layer; and
   forming a second polysilicon region that fills the trench and contacts the dielectric layer.

2. The method of claim 1, wherein:
   the dielectric layer comprises a first portion formed on the first polysilicon region; and
   the second polysilicon region comprises a second portion formed on the dielectric layer.

3. The method of claim 2, further comprising:
   etching at least the second portion of the second polysilicon region;
   etching at least the first portion of the dielectric layer; and
   etching the first polysilicon region on the protection layer, wherein the trench has a depth greater than about 2 micrometers from an upper surface of the protection layer to the dielectric layer at the bottom surface of the trench.

4. A method of forming a silicon-on-insulator (SOI) structure, comprising:
   providing a SOI substrate that includes:
      a handle layer,
      an insulation layer comprising silicon dioxide and arranged over the handle layer, and
      a buried layer arranged over the insulation layer;
   forming a shallow trench isolation (STI) layer on the buried layer;
   forming a Silicon Nitride (SiN) layer on the STI layer;
   forming a trench extending downward from an upper surface of the SiN layer through the STI layer and the buried layer and terminating in the handle layer;
   forming a dielectric layer comprising a bottom portion that extends along and is located on a bottom surface of the trench and contacting the handle layer, wherein
      the dielectric layer comprises: a first sub-layer of lining oxide, and a second sub-layer of pad oxide that is formed on the first sub-layer and is thicker than the first sub-layer,
      the bottom portion of the dielectric layer comprises a first bottom portion of the first sub-layer and a second bottom portion of the second sub-layer; and
   a polysilicon region filling the trench and contacting the second bottom portion of the second sub-layer in the dielectric layer.

5. The method of claim 4, wherein the trench has a depth greater than about 2 micrometers.

6. The method of claim 5, wherein the trench has a depth of about 3.5 micrometers.

7. The method of claim 4, wherein the dielectric layer comprises silicon oxide.

8. The method of claim 4, wherein the dielectric layer has a thickness ranging between about 500 angstroms and about 0.1 micrometer.

9. The method of claim 4, wherein:
   the first sub-layer of lining oxide has a thickness between about 150 angstroms and about 300 angstroms, and
   the second sub-layer of pad oxide has a thickness between about 350 angstroms and about 1000 angstroms.

10. The method of claim 9, wherein the first sub-layer of lining oxide has a thickness of about 250 angstroms and the second sub-layer of pad oxide has a thickness of about 500 angstroms.

11. The method of claim 9, wherein the pad oxide comprises tetraethoxysilane (TEOS).

12. The method of claim 4, wherein the dielectric layer extends to sidewalls of the trench.

13. The method of claim 4, wherein the handle layer comprises a bulk silicon wafer.

14. The method of claim 4, further comprising forming a transistor on the buried layer.

15. A method of forming a semiconductor structure, comprising:
   providing a substrate that includes:
      a handle layer,
      an insulation layer comprising silicon dioxide and arranged over the handle layer,
      a buried layer arranged over the insulation layer;
   forming a shallow trench isolation (STI) layer on the buried layer;
   forming a Silicon Nitride (SiN) layer on the STI layer;
   forming a plurality of trenches each of which extends downward from an upper surface of the SiN layer and through the STI layer and the buried layer and terminates in the handle layer, wherein the buried layer is divided into a plurality of functional areas by the plurality of trenches;
   forming a dielectric layer located on a bottom surface of each of the plurality of trenches and contacting the handle layer;
   forming a polysilicon region located in each of the plurality of trenches and contacting the dielectric layer; and
   forming a plurality of transistors in the plurality of functional areas of the buried layer respectively and electrically connected through metal lines over the plurality of transistors during a charging process.

16. The method of claim 15, wherein each of the plurality of functional areas is formed between a pair of adjacent trenches.

17. The method of claim 16, wherein the plurality of functional areas comprises a first functional area and a second functional area that is smaller than the first functional area.

18. The method of claim 15, wherein the plurality of transistors comprises:
 a first transistor formed on the buried layer in the first functional area; and
 a second transistor formed on the buried layer in the second functional area, wherein the first transistor and the second transistor are electrically connected during a charging process.

19. The method of claim 15, wherein each of the plurality of trenches has a depth greater than about 2 micrometers.

20. The method of claim 15, wherein the dielectric layer extends to sidewalls of the trench and comprises a sub-layer of lining oxide with a thickness of about 250 angstroms and a sub-layer of pad oxide with a thickness of about 500 angstroms.

* * * * *